United States Patent
Kaltenegger et al.

(10) Patent No.: US 7,812,590 B2
(45) Date of Patent: Oct. 12, 2010

(54) METHOD FOR DETECTION OF THE PRESENCE OF A LOAD AND DRIVE CIRCUIT

(75) Inventors: Martin Kaltenegger, Graz (AT); Gunter Schwarzberger, Reitmehring (DE); Heinrich Trebo, Hitzendorf (AT); Peter Lang, Graz (AT)

(73) Assignee: Infineon Technologies AG, Neubiberg (DE)

( * ) Notice: Subject to any disclaimer, the term of this patent is extended or adjusted under 35 U.S.C. 154(b) by 315 days.

(21) Appl. No.: 11/856,425

(22) Filed: Sep. 17, 2007

(65) Prior Publication Data

US 2009/0072809 A1 Mar. 19, 2009

(51) Int. Cl.
*G01R 19/00* (2006.01)
*G01N 27/416* (2006.01)

(52) U.S. Cl. .................................. 324/76.11; 324/429
(58) Field of Classification Search .............. 324/76.11, 324/429
See application file for complete search history.

(56) References Cited

U.S. PATENT DOCUMENTS

| | | | | |
|---|---|---|---|---|
| 4,962,350 A | * | 10/1990 | Fukuda | 323/283 |
| 5,920,452 A | * | 7/1999 | Sullivan | 361/101 |
| 6,226,602 B1 | * | 5/2001 | Schmitt et al. | 702/117 |
| 6,696,871 B2 | * | 2/2004 | Bienvenu et al. | 327/134 |
| 7,504,743 B2 | * | 3/2009 | Matsumoto et al. | 307/10.1 |
| 2004/0128595 A1 | * | 7/2004 | Schoenborn et al. | 714/724 |
| 2004/0183463 A1 | * | 9/2004 | Sun et al. | 315/224 |
| 2004/0257735 A1 | | 12/2004 | Horsky et al. | |

FOREIGN PATENT DOCUMENTS

| | | |
|---|---|---|
| EP | 0743529 | 11/1996 |
| EP | 0963043 | 12/1999 |
| WO | 2006009377 | 1/2006 |

OTHER PUBLICATIONS

TLE4729G Product information sheet, Feb. 25, 2004.
TLE6209R Product information sheet, Oct. 15, 2001.

* cited by examiner

*Primary Examiner*—Hoai-An D Nguyen
(74) *Attorney, Agent, or Firm*—Banner & Witcoff, Ltd.

(57) ABSTRACT

Methods and apparatuses for detection of a presence of a load. A method may include, for example, applying and subsequently removing a supply voltage across the pair of nodes, comparing an electrical potential at one of the pair of nodes at a time after the supply voltage is removed with a reference value, and generating a signal having a value that depends upon an outcome of the comparison.

19 Claims, 7 Drawing Sheets

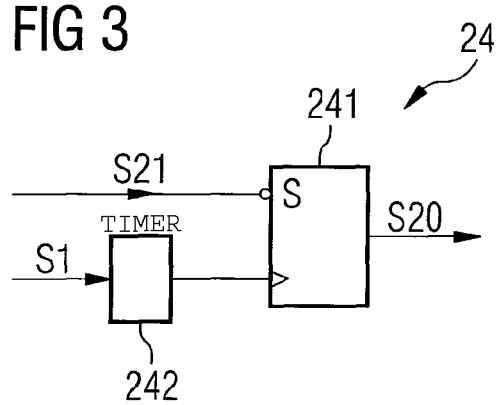
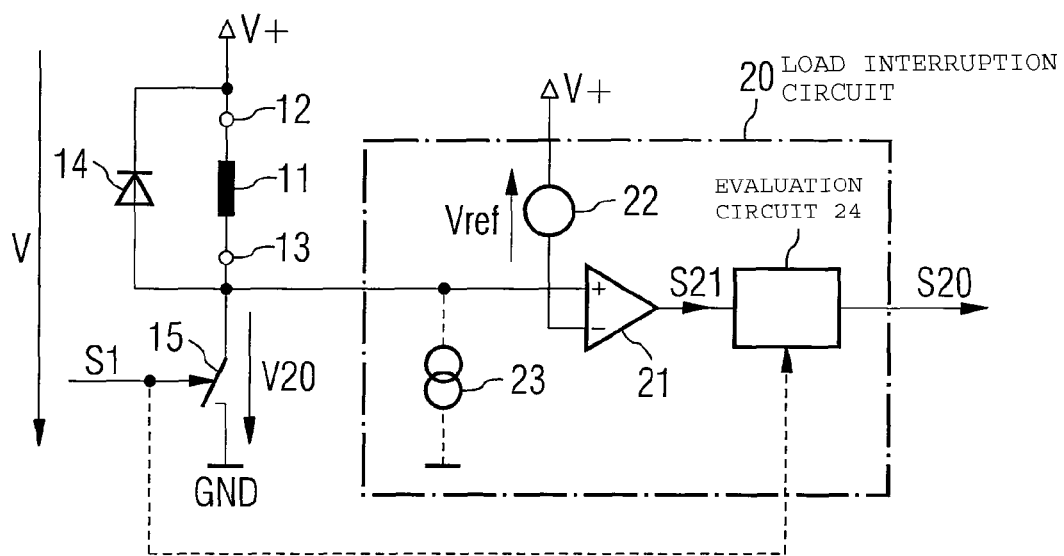

METHOD FOR DETECTION OF THE PRESENCE OF A LOAD AND DRIVE CIRCUIT

TECHNICAL BACKGROUND

Inductive loads, such as electric motors or solenoid valves, are used for widely differing purposes, for example in motor vehicles. Particularly in the case of applications which are safety-relevant, such as occupant protection systems, or which influence the emission of hazardous substances from the vehicle, there are stringent requirements for the reliability of the inductive loads and for the drive circuits which drive the loads. For example, an interruption in an electrical line connection between the load and the drive circuit or within the inductive load itself can lead to a failure of the inductive load. The presence of the load and its correct operation are in this case intended to be detected regularly, ideally during operation.

SUMMARY

Various aspects are described herein. For example, according to some aspects, methods and apparatuses are provided for detection of a presence of a load. A method may include, for example, applying and subsequently removing a supply voltage across a pair of nodes, comparing an electrical potential at one of the pair of nodes at a time after the supply voltage is removed with a reference value, and generating a signal having a value that depends upon an outcome of the comparison.

These and other aspects are described in further detail with reference to various illustrative embodiments.

BRIEF DESCRIPTION OF THE FIGURES

Exemplary embodiments will be explained in more detail in the following text with reference to the figures. Unless stated to the contrary, the same reference symbols in the figures denote identical circuit components, and signals having the same meaning.

FIG. 3 shows one example of a circuit for identification of a load interruption.

FIG. 4 shows a circuit arrangement that has been modified in comparison to the circuit arrangement shown in FIG. 1.

DETAILED DESCRIPTION

Figure 1:
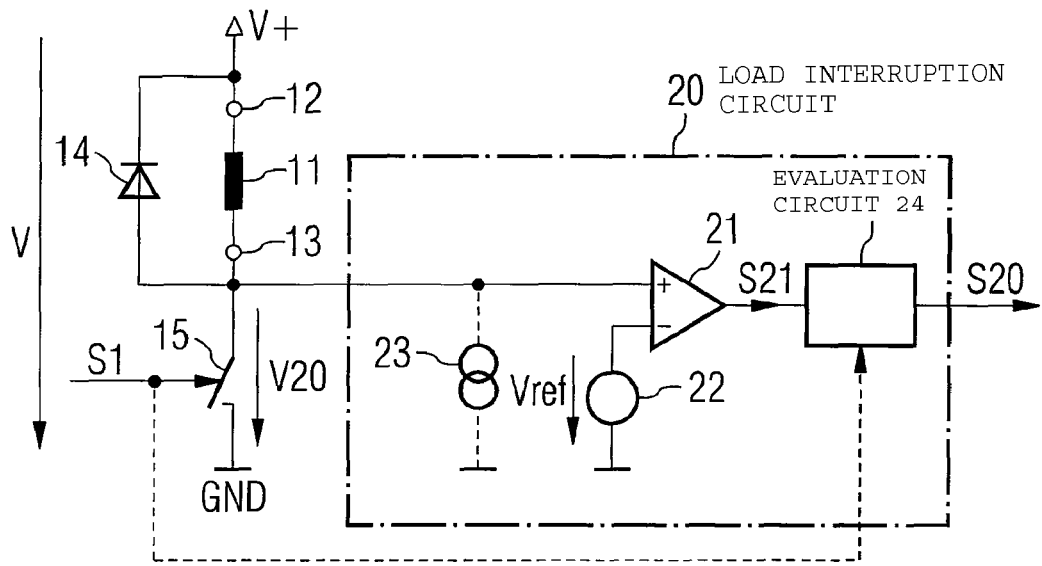
FIG. 1 shows a first example of a drive circuit for driving a load, having a circuit for identification of load interruption.

FIG. 1 shows a first exemplary embodiment of a drive circuit for driving a load 11, in particular an inductive load. By way of example, this inductive load 11 is a direct-current electric motor or a solenoid valve, and can be driven by cyclic application of a supply voltage. In the course of a cyclic drive process such as this, a drive voltage is applied to the inductive load during each of successive drive periods for a switched-on period which is followed by a switched-off period. The duty ratio (duty cycle) of the cyclic drive, that is to say the ratio between the switched-on period and the total duration of the drive period, governs the motor current and thus the torque, for example in the case of an electric motor. Indirectly, this also influences the rotation speed.

For cyclic application of a supply voltage between the connecting terminals 12, 13 and thus across the load 11—if there is one—the drive circuit which is illustrated in FIG. 1 has a voltage supply terminal for a first supply potential or positive supply potential V+, and a second voltage supply terminal for a second supply potential, or reference ground potential GND, for example ground. In the following text, V denotes a supply voltage which is applied between the voltage supply terminals.

The drive circuit also has a switching arrangement for cyclic application of the supply voltage V to the connecting terminals 12, 13. This switching arrangement is in the form of a switch 15 in the example shown in FIG. 1, which is connected as a low-side switch between the second connecting terminal 13 for the load and the second voltage supply terminal. The first connecting terminal 12 for the load 11 in the drive circuit illustrated in the figure is connected to the first voltage supply terminal. The switching element 15 is, for example, a semiconductor switch, such as a metal-oxide-semiconductor field-effect transistor (MOSFET), an insulated-gate bipolar transistor (IGBT) or a bipolar transistor, and is driven by a pulse-width-modulated drive signal S1 during operation of the drive circuit. In the case of this drive circuit, any load 11 which is present is connected in series with the switching element 15 between the supply voltage terminals, such that, when the switch 15 is switched on, the supply voltage V between the supply voltage terminals is applied virtually in its entirety across the load 11. The duty ratio of the pulse-width-modulated signals S1 in this case governs the duty ratio used to cyclically apply the supply voltage V to the inductive load 11.

When the switching element 15 is closed, the inductive load 11 receives electrical energy. In order to allow the inductive load 11 to be commutated off after the switching element 15 has been opened, a freewheeling element 14 is provided, and in the illustrated example is connected between the connecting terminals 12, 13 and therefore in parallel with any load 11 that is present. This freewheeling element in the illustrated example is in the form of a diode, which is connected in the forward-biased direction between the second and first connecting terminals 13, 12.

Figure 2:
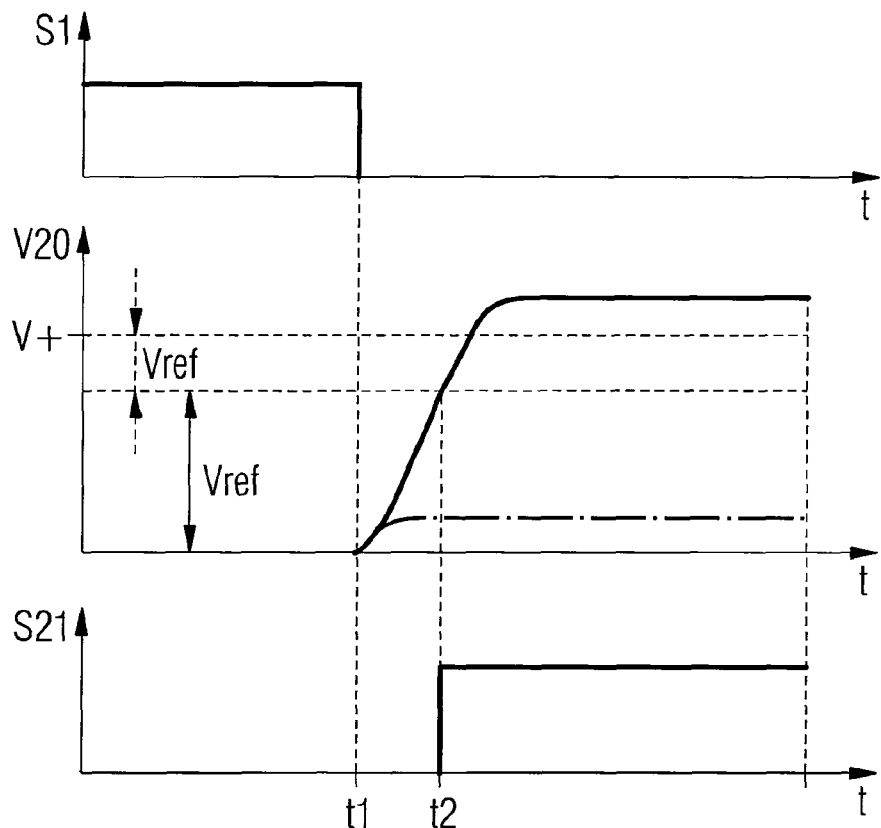
FIG. 2 shows, by way of example, time profiles of the signals which occur in the drive circuit shown in FIG. 1, in order to illustrate a method of operation.

FIG. 2 uses time profiles of the drive signal S1 of the switching element 15 and of an electrical potential V20 at the second connecting terminal 13, which is referred to in the following text as the evaluation potential, to illustrate the method of operation of the drive circuit illustrated in FIG. 1.

For explanatory purposes, it is assumed in this case that the switch 15 is first of all closed prior to a first time t1. Approximately all of the supply voltage prior to this time is applied between the connecting terminals 12, 13 and thus across the inductive load 11, provided that there is no short circuit in the load 11, as will be assumed in the following explanation. The detection of a load short-circuit such as this is not the subject matter of the present example. When approximately all of the supply voltage is applied between the connecting terminals 12, 13, the electrical potential V20 at the second connecting terminal 13 when the switch 15 is closed, or switched on, corresponds to the reference ground potential GND, ignoring any resistance of the switch 15 when it is switched on. In this case, the voltage across the switch 15 is 0.

If the switch 15 is opened at the time t1, then the electrical potential at the second connecting terminal 13 starts to rise because of the energy that has previously been stored in the inductive load 11, and a freewheeling current starts to flow via the freewheeling element 14 between the connecting terminals 12, 13. During this process, the electrical potential at the second connecting terminal 13 is greater than the first supply potential V+, to be precise by a value which corresponds to the forward voltage of the freewheeling diode 14.

The rate at which the electrical potential V20 at the second connecting terminal 13 rises, starting from the reference ground potential GND, after the switch 15 is opened is in this case dependent on the electrical energy previously stored in the inductive load 11 when the switch 15 was closed, and, for any given switched-on period, is dependent on the inductance of the inductive load, and on the rate of change of the current flowing through the load. This rate of change of the current is in this case dependent on the switching behavior of the switch 15, in particular on its switching rate. The stored energy for a given switched-on period is in this case greater, the greater the inductance of the inductive load 11. In a corresponding manner, the current level of a freewheeling current I11 which flows through the load 11 after the switch 15 has been opened is dependent on the electrical energy previously stored in the inductive load 11, and is therefore dependent on the inductance of the load. As the duration of the freewheeling current increases, and therefore as the demagnetization of the inductive load 11 increases, the electrical potential at the second connecting terminal 13 falls again, although this is not illustrated explicitly in FIG. 2. The time scale in FIG. 2 is chosen such that the time period during which the inductive load 11 is commutated off is very long in comparison to the rise time of the electrical potential V20 after opening the switch 15.

In order to explain this further, a fault situation will be considered in which an electrical connection between the two connecting terminals 12, 13 is completely interrupted, and in which the electrical impedance between the connecting terminals 12, 13 is exclusively resistive, with its value being dependent on the electrical insulation between the connecting terminals 12, 13, and in the ideal case, tending to infinity. If the resistance between the connecting terminals 12, 13 is infinitely high, the electrical potential at the second connecting terminal 13 remains at the reference ground potential after the switch 15 has been opened. The expression "normal operating state" in the following text refers to an operating state in which a drivable inductive load 11 is connected between the connecting terminals 12, 13. The expression "interruption state" refers to an operating state in which an electrical connection between the connecting terminals 12, 13 is interrupted. An interruption such as this can result from a defect in the inductive load or from an interruption in the supply lines to the load. In order to make it possible to distinguish between an interruption state such as this and a normal operating state, one exemplary embodiment provides for the electrical potential V20 at the second connecting terminal 13 to be evaluated after the switch 15 has been opened, and for determination of whether the magnitude of the difference between the electrical potential V20 after the switch has been opened and the electrical potential V20 before the switch was opened, with this being referred to in the following text as the voltage shift or potential shift, is greater than a predetermined comparison value. In this case, use is made of the knowledge that a change in the electrical potential V20 at the second connecting terminal 13 after the switch has been opened presupposes an inductive load between the connecting terminals 12, 13, which received electrical energy when the switch 15 was previously closed and is commutated off via the freewheeling diode 14 after the switch 15 has been opened thus resulting in an increase in the electrical potential at the second connecting terminal 13.

In order to detect the presence of an inductive load 11 and in order to detect an interruption in the inductive load, the drive circuit illustrated in FIG. 1 has a circuit for detection/identification of a load interruption 20, and this circuit is connected to the second connecting terminal 13 of the drive circuit. The illustrated circuit 20 has a comparator arrangement 21, for example a comparator which compares the voltage shift of the evaluation potential V20 with the comparison value. In the illustrated example, the comparator arrangement 21 for this purpose compares the evaluation potential with a reference voltage Vref which is produced by a reference voltage source 22. This reference voltage $V_{ref}$ in the example corresponds to the comparison value with which the voltage shift in the evaluation potential is compared. During the switched-on period, the electrical potential V20 at the second connecting terminal 13 is the reference ground potential, as has already been explained above. In order to determine whether this potential V20 rises by more than the value of the reference potential $V_{ref}$ after the switch has been opened, the reference voltage source 22 in the illustrated example is connected between one of the inputs, in the example the negative input, of the comparator 21 and the reference ground potential GND. Another input, in the example the positive input, of the comparator 21 is connected to the second connecting terminal 13 of the drive circuit. A comparison signal S21 is available at the output of the comparator 21, and is dependent on comparison of the electrical potential V21 at the second connecting terminal 13 and the reference potential $V_{ref}$. This comparison signal S21 in the illustrated example assumes a high level when the evaluation potential V20 at the second connecting terminal 13 is greater than the reference voltage $V_{ref}$. This is equivalent to the evaluation potential V20 after the switch has been opened rising by more than the reference voltage $V_{ref}$ above the value of the evaluation potential before the switch was opened, and the potential shift of the evaluation potential being greater than the reference voltage $V_{ref}$ which corresponds to the comparison value.

In the case of the circuit illustrated in FIG. 1 for identification of a load interruption 20, the output of the comparator 21 is followed by an evaluation circuit 24 which is designed to evaluate the comparison signal S21 at a predetermined evaluation time. The timing of the evaluation point is, for example, dependent on the pulse-width-modulated drive signal S1 for the switch 15. Provision is therefore made in one exemplary embodiment for the evaluation time to occur at a predetermined time after the time at which the drive signal S1 assumes a level at which the switch 15 is switched off or on.

The reference voltage $V_{ref}$ is chosen such that the evaluation potential V20 when the inductive load 11 is connected correctly and is intact changes during the drive pause of the switch 15 by a potential value which is greater than the reference voltage $V_{ref}$. For the drive circuit illustrated in FIG. 1, the potential shift in the evaluation potential V20 after the switch 15 has been opened corresponds to the sum of the supply voltage V and the forward voltage of the freewheeling diode 14. The reference voltage $V_{ref}$ may be chosen within a wide range and may, for example, be dependent on the supply voltage V. For example, the reference voltage may be between 50% and 75% of the supply potential. A reference voltage such as this, which is dependent on the supply voltage, may, for example, be derived via a simple voltage divider (not illustrated) from the supply voltage V between the supply voltage terminals.

In a further exemplary embodiment, the reference voltage $V_{ref}$ has a constant value which is independent of the supply voltage V and, for example, is between 3V and 5V for the exemplary embodiment shown in FIG. 1. A constant reference voltage such as this can be produced by a reference voltage source (not illustrated) such as a bandgap reference circuit.

The choice of the comparison value governs the disturbance sensitivity of the circuit for detection of the load interruption, as will be explained in the following text with reference to two extreme examples: if the value of the reference voltage $V_{ref}$ is chosen to be very small, then even small inductances, such as parasitic inductances between the connecting terminals, will be sufficient to cause the evaluation potential to rise above the reference voltage $V_{ref}$. If, in contrast, the comparison value and the reference value $V_{ref}$ are chosen to be very large, then there is a risk of a spuriously detected load interruption, since the presence of a load will be detected only after a major rise in the evaluation potential.

The circuit for identification of a load interruption 20 optionally has a current source 23 which, in the illustrated example, is connected between the second connecting terminal 13 and the reference ground potential GND. This current source is in this case chosen such that its current is less than the freewheeling current which flows when the inductive load is connected correctly. The current source 23 thus has no influence, or only a minor influence, on the evaluation potential V20 when the inductive load 11 is connected correctly and is intact. When no inductive load is connected, or an inductive load which is not intact is connected, the current source 23 results in any parasitic inductance which may be present between the connecting terminals 12, 13, and/or any parasitic resistance, causing the evaluation potential at the second connecting terminal 13 not to rise above the value of the reference voltage $V_{ref}$ after the switch 15 has been opened. Any current flowing as a result of parasitic effects such as these after the switch 15 has been opened is in this case less than or equal to the current received from the current source 23, so that the evaluation potential V20 in this case remains below the reference voltage $V_{ref}$ after the switch 15 has been opened. If no inductive load is present, or the inductive load is not intact, and there is a pure resistance between the connecting terminals 12, 13, current source 23 results in the majority of the supply voltage V definitely being dropped between the connecting terminals 12, 13, so that the supply potential V20 likewise remains below the reference voltage $V_{ref}$. The profile of the evaluation potential V20 is illustrated using dashed-dotted lines in FIG. 2 for the situation in which a resistive load is provided between the connecting terminals 12, 13 and a current source 23 in the circuit for identification of a load interruption. The resistance of this resistive load is in this case less than infinity, so that, although the value of the evaluation potential V20 is not equal to zero, it is less than the reference voltage or the reference potential $V_{ref}$. The choice of the reference voltage $V_{ref}$ in this case governs the resistance of the resistive load from which a load interruption will be detected. The greater the reference voltage $V_{ref}$ is in the example shown in FIG. 1, the lower is the resistance from which a load interruption will be detected.

One possible circuitry implementation example of the evaluation circuit 24 is illustrated in FIG. 3. In this exemplary embodiment, the evaluation circuit 24 comprises a flip flop 241 with an inverting set input S to which the comparator signal S21 is supplied, and with a clock input to which a timer signal S242 is supplied. The timer 242 is driven by the drive signal S1 for the switch 15 and is in each case set at a time at which the switch 15 is opened, that is to say for example on a falling edge of the drive signal S1. The output signal S242 from this timer 242 changes its level from a first level value, for example a low level, to a second level value, for example a high level, after a waiting time, which is predetermined by the timer 242, has elapsed. The flip flop 241 is designed to evaluate the comparator signal S41 applied to the set input at the time of this level change, and to set the flip flop 241 when the comparison signal S21 assumes a low level at this time. With reference to the exemplary embodiment shown in FIGS. 1 and 2, setting of the flip flop 241 is therefore equivalent to the evaluation potential V20 not having exceeded the reference voltage $V_{ref}$ at the evaluation time, which is therefore in turn equivalent to no intact inductive load being connected between the connecting terminals 12, 13. An output signal from the flip flop 241 represents the state in which a load is connected between the connecting terminals 12, 13, in which case, for example, a high level of this output signal S20 indicates that no inductive load is present, or that an inductive load is present that is not intact. The output signal S20 from the circuit for identification of a load interruption is therefore used as a load interruption signal.

In the circuit illustrated in FIG. 1, the reference voltage $V_{ref}$ is related to a reference ground potential GND. In this example, the reference voltage $V_{ref}$ corresponds to the comparison value with which the potential shift of the evaluation potential is compared. Alternatively, with reference to FIG. 4, it is possible to connect the reference voltage source between one of the inputs of the comparator 21 and the supply potential V+. In this case, the presence of a load between the connecting terminals 12, 13 is assumed when the evaluation potential rises after the switch has been opened to a value which is greater than the supply potential V+ minus the reference voltage $V_{ref}$. The comparison value with which the potential shift in the evaluation potential is compared in this case corresponds to the difference between the supply potential V+ and the reference voltage $V_{ref}$, and is therefore dependent on the supply potential or the supply voltage V+. The dashed arrow annotated $V_{ref}$ in FIG. 2 illustrates the determination of the comparison value in this situation.

Figure 5:
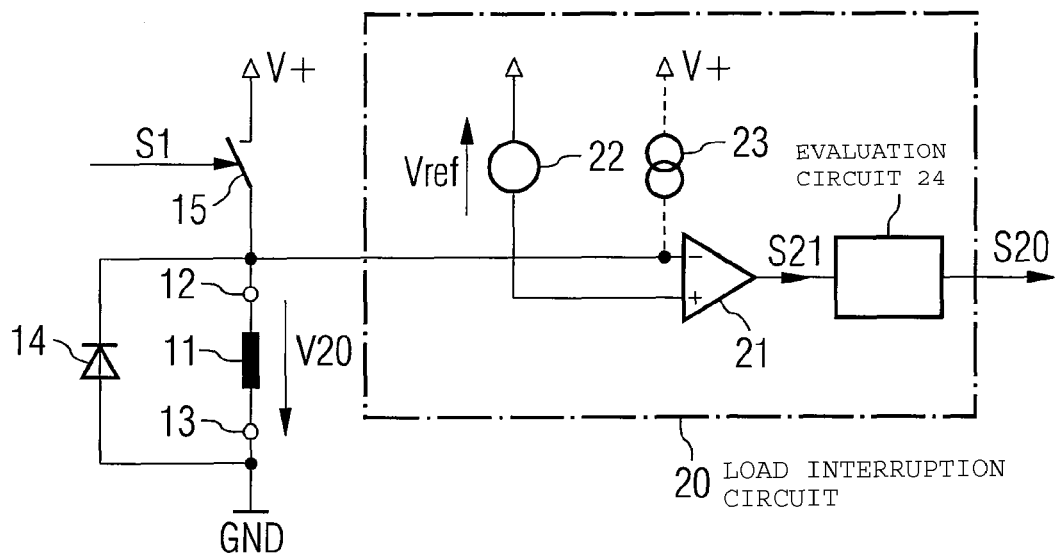
FIG. 5 shows a second example of a drive circuit for driving a load.

FIG. 5 shows a second exemplary embodiment of a drive circuit for driving a load. This drive circuit differs from the drive circuit illustrated in FIG. 1 in that the switch 15 is in the form of a high-side switch, that is to say it is connected between the first supply potential terminal and the first connecting terminal 12, while the second connecting terminal is connected to the supply potential terminal for the reference ground potential GND. The circuit for identification of a load interruption 20 in the case of this drive circuit is connected to the first connecting terminal 12. The evaluation potential V20 therefore corresponds to an electrical potential at this first connecting terminal 12.

Figure 6:
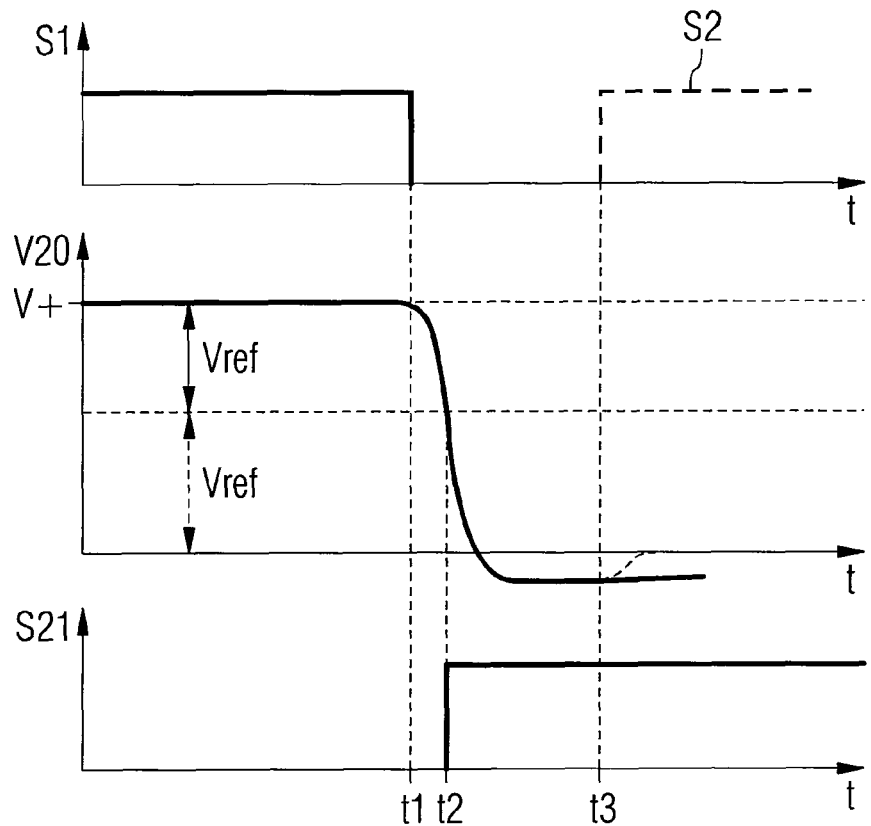
FIG. 6 shows time profiles of selected signals which occur in the drive circuit shown in FIG. 5, in order to illustrate a method of operation.

FIG. 6 illustrates time profiles of the drive signal S1 for the switch 15, of the evaluation potential V20 and of the comparator signal S21 at the output of the comparator 21 in the circuit for identification of a load interruption 20. In the case of the drive circuit illustrated in FIG. 5, the evaluation potential V20 during a period in which the switch 15 is switched on corresponds to the positive supply potential V+—ignoring line resistances and the resistance of the switch 15 when it is switched on. When an inductive load 11 is present between the connecting terminals 12, 13, the evaluation potential V20 falls after the switch 15 has been opened to a negative value, which is less than the reference ground potential GND by the value of the field voltage of the freewheeling diode 14. Any voltage shift in the evaluation potential V20 after the switch 15 has been opened corresponds, as in the case of the exemplary embodiment shown in FIG. 1, to the sum of the supply voltage V+ and the forward voltage of the freewheeling diode 14.

In the case of the drive circuit illustrated in FIG. 5, it is assumed that an inductive load 11 is intact and correctly connected when the evaluation potential V20 after the switch 15 has been opened falls by more than the value of the reference voltage $V_{ref}$. The comparison value with which the potential shift of the evaluation potential is compared in this case corresponds to the reference voltage $V_{ref}$. The reference voltage source which produces the reference voltage $V_{ref}$ is for this purpose connected, with reference to FIG. 5, between the positive input of the comparator 21 and the terminal for the positive supply potential V+. The evaluation potential V20 is in this case supplied to the negative (inverting) input of the comparator. In this case—as in the other examples as well—the reference voltage $V_{ref}$ may be a constant voltage that is produced by a constant voltage source, or may be dependent on the supply voltage V+, and in this case may, in particular, be proportional to the supply voltage V+.

The current source 23 that is optionally provided for this drive circuit is connected between the first connecting terminal 12 and, in the same way, the terminal for the positive supply potential V+. The comparator signal V21 at the output of the comparator 21 in this case assumes a high level when the evaluation potential V20 has fallen by the value of the reference voltage $V_{ref}$ below the positive supply potential V+, as is illustrated at a time t2 in FIG. 6.

Figure 7:
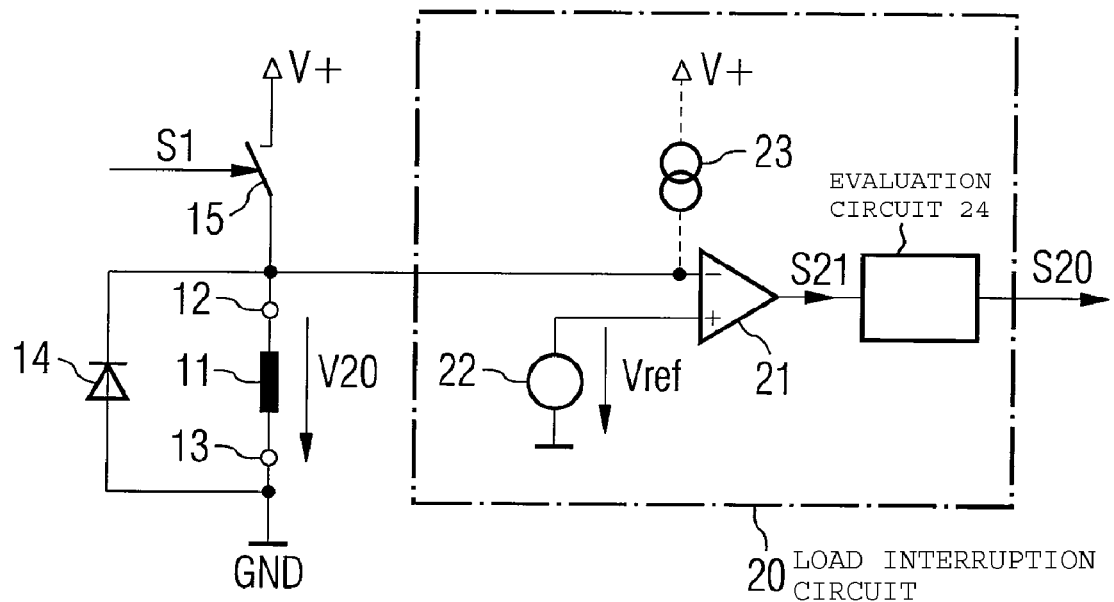
FIG. 7 shows a third example of a drive circuit for driving a load.

FIG. 7 shows a modification of the circuit arrangement illustrated in FIG. 5. In this circuit arrangement, the reference voltage $V_{ref}$ is related to the reference ground potential GND. The reference voltage source 22 is for this purpose connected between one of the inputs of the comparator, in the example the positive input, and the reference ground potential GND. The voltage shift which the evaluation potential V20 must at least reach in this circuit in order to detect that the load is present is in this case depends on supply voltage V+ and the reference voltage $V_{ref}$. In the case of this circuit, the presence of a load is assumed when the evaluation potential V20 after the switch has been opened falls below the value of the reference potential $V_{ref}$. The voltage shift in the evaluation potential V20 is in this case greater than the difference between the supply voltage V+ and the reference voltage $V_{ref}$. The comparison value by which the evaluation potential V20 must differ at least from the value before the switch was opened after the switch has been opened in order to detect the presence of a load corresponds in this case to this difference between the supply voltage V+ and the reference voltage $V_{ref}$. In this case, as already explained above, the reference voltage $V_{ref}$ may be dependent on the supply voltage V or may be independent of the supply voltage V.

In the case of the circuit arrangement illustrated in FIG. 7, the voltage shift of a voltage across the load 11 is evaluated.

Figure 8:
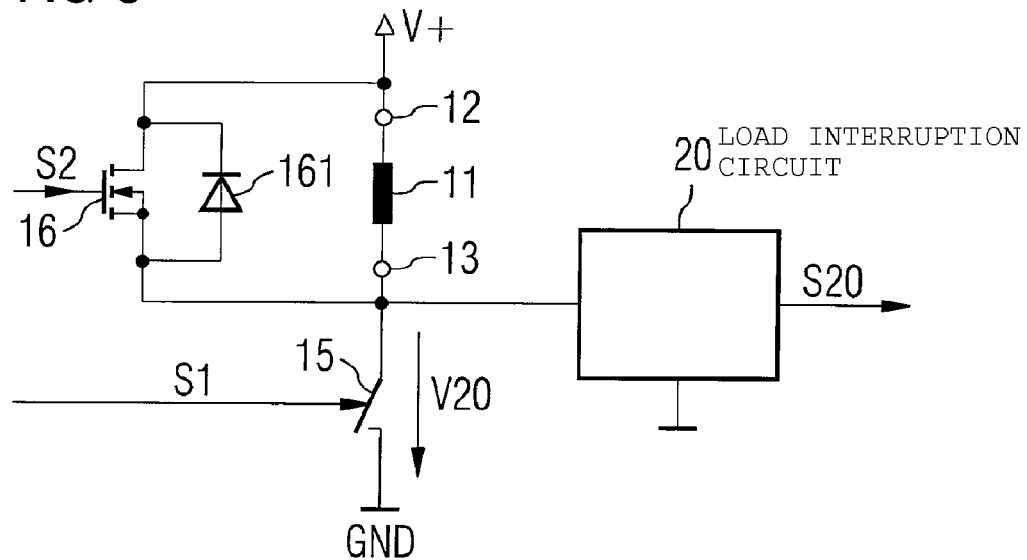
FIG. 8 shows a fourth example of a drive circuit for driving a load.

FIG. 8 shows a drive circuit, modified from the drive circuit shown in FIG. 1, for an inductive load 11. In the case of this drive circuit, a switchable freewheeling element 16 is connected between the connecting terminals 12, 13 and, in the illustrated example, is in the form of a MOSFET with an integrated body diode 161. This freewheeling element 16 is driven by a second drive signal S2 which, during operation of the drive circuit, is matched to the drive signal S1 for the switch 15 such that the freewheeling element 16 and the switch 15 are not switched on at the same time, thus avoiding parallel currents. In the case of this circuit, the body diode of the MOSFET carries a freewheeling current during the delay time between the switch 15 being switched off and the MOSFET 16 being switched on. The circuit 20 for detection of the load interruption is illustrated just as a circuit block in FIG. 8, and is implemented, for example, in a corresponding manner to the circuit illustrated in FIG. 1.

Figure 9:
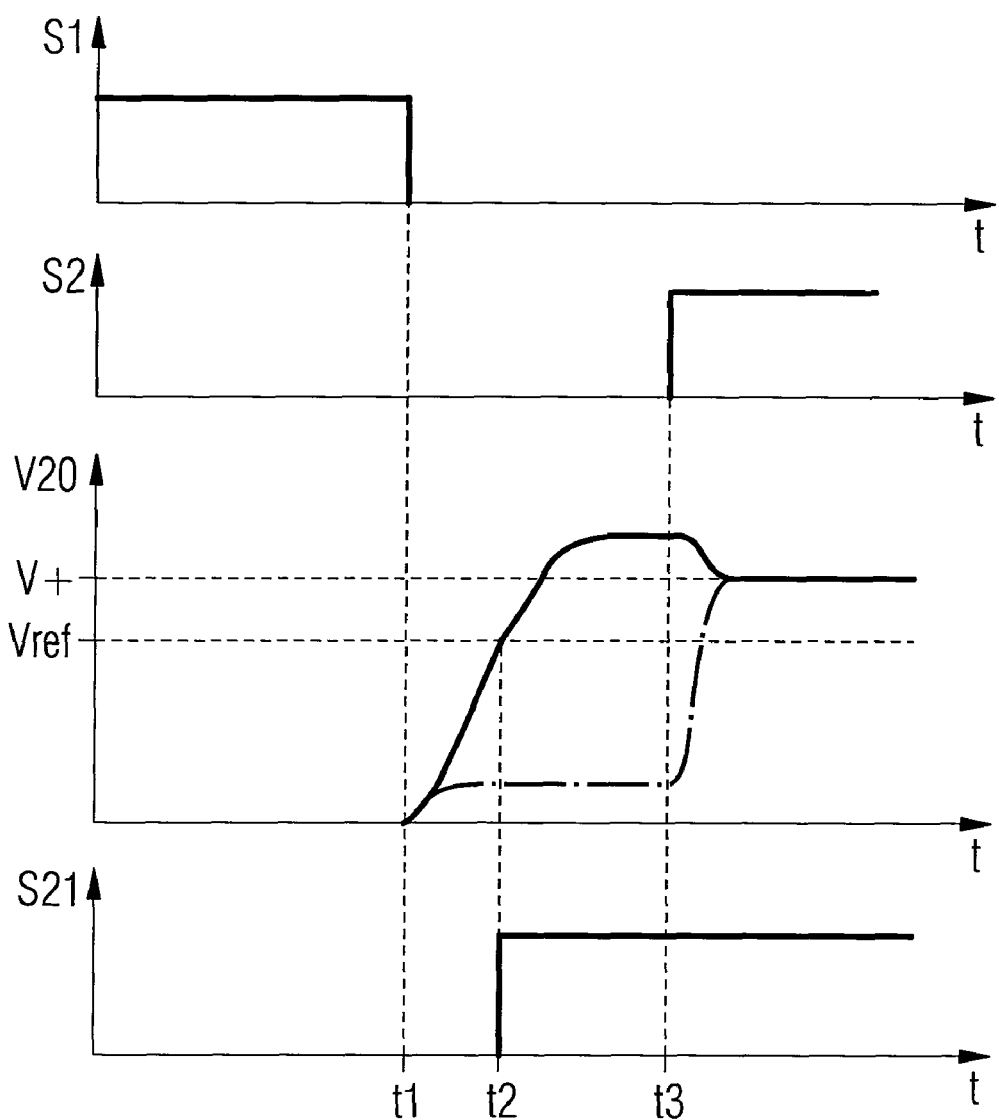
FIG. 9 shows time profiles of selected signals which occur in the drive circuit shown in FIG. 8, in order to illustrate a method of operation.

FIG. 9 shows time profiles of the first and second drive signals S1, S2 for the evaluation potential V20 at the second connecting terminal 13, and of the comparator signal S21 which is produced in the circuit 20 for identification of a load interruption. In the case of the drive circuit illustrated in FIG. 8, the freewheeling element 16 is switched on with a time delay of the drive signal S2 after the switch S1 has been opened. In FIG. 9, t1 denotes a time at which the switch S1 is switched off, and t3 denotes a later time, at which the freewheeling element 16 is switched on. Immediately after opening of the switch 15, the drive circuit illustrated in FIG. 8 operates in a corresponding manner to the drive circuit illustrated in FIG. 1. The integrated freewheeling diode 161 in the freewheeling element 16 in this case operates in a corresponding manner to the freewheeling diode 14 illustrated in FIG. 1. Once the switch 15 has been opened and when a correctly connected and intact inductive load is present, the evaluation potential V20 in this case rises to a potential value which corresponds to the sum of the supply voltage V+ and the forward voltage of the integrated freewheeling diode 161. After the freewheeling element has been switched on, a freewheeling current path arises between the connecting terminals 12, 13 and carries current in both directions, in contrast to the situation in the case of the freewheeling element 14 shown in FIG. 1 or of the integrated freewheeling diode 161. In consequence, when an inductive load is present, the evaluation potential V20 falls to the value of the upper supply potential V+.

FIG. 9 uses dashed-dotted lines to show the time profile of the evaluation potential V20 when no inductive load is present or when a resistive load is present between the connecting terminals 12, 13. Starting from a low potential value, the evaluation potential rises in this case, when the freewheeling element 16 is being driven, to the value of the positive supply potential V+. The evaluation time at which the evaluation potential is evaluated in order to detect the presence of an inductive layer occurs, for example, between the time t1 at which the switch 15 is switched off and the time t3 at which the freewheeling element 16 is switched on. By way of example, the evaluation time occurs a predetermined time period before the time t3 at which the freewheeling element 16 is switched on.

Since in this example the evaluation potential V20 changes only after a time delay from the start of the driving of the freewheeling element, as a result of switching delays, a further exemplary embodiment provides for the evaluation potential V20 to be evaluated at the start of the drive of the freewheeling element.

Figure 10:
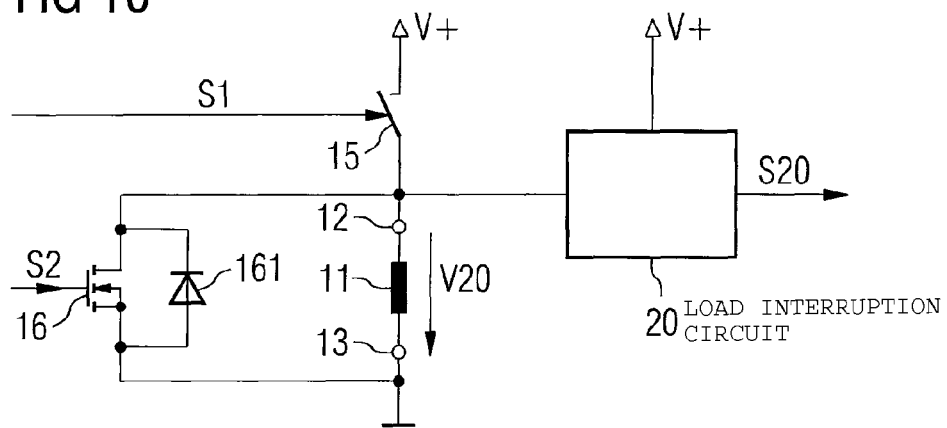
FIG. 10 shows a fifth example of a circuit arrangement for driving a load.

FIG. 10 shows a modification of the drive circuit illustrated in FIG. 7. In the case of the drive circuit illustrated in FIG. 10, a switchable freewheeling element 16 is connected, instead of a freewheeling diode, between the connecting terminals 12, 13. This freewheeling element 16 is in the form of a MOSFET with an integrated freewheeling diode 161 in the illustrated example, and is driven by a second drive signal S2. In a corresponding manner to the drive circuit illustrated in FIG. 8, the freewheeling element 16 in the drive circuit shown in FIG. 10 is switched on with a time delay after the switch 15 has been opened. FIG. 5 uses dashed lines to show a time profile of the second drive signal S2 of the freewheeling element 16 for the drive circuit illustrated in FIG. 8. In this case, t3 denotes a time at which the freewheeling element 16 is switched on. The time profile of the evaluation potential V20 for the drive circuit illustrated in FIG. 10 corresponds, until the time t3, to the time profile of the evaluation potential V20 for the drive circuit shown in FIG. 7. Once the freewheeling element 16 has been switched on, the evaluation potential V20 changes in the direction of the reference ground potential GND. An evaluation time at which the evaluation potential V20 is evaluated for detection of the presence of an inductive load occurs between the times t1 and t3 and, for example, occur a predetermined time period before the freewheeling element 16 is switched on. This evaluation time may, however, also correspond to the time t3 at which the freewheeling element is switched on.

The circuit for identification of a load interruption 20 in the case of the drive circuit shown in FIG. 9 is illustrated just as a circuit block. This circuit 20 may be, for example, implemented in a corresponding manner to the circuit for identification of a load interruption as shown in FIG. 4, that is to say it may have a reference voltage source which is connected between the terminal for the positive supply potential V+ and a comparator.

Figure 11:
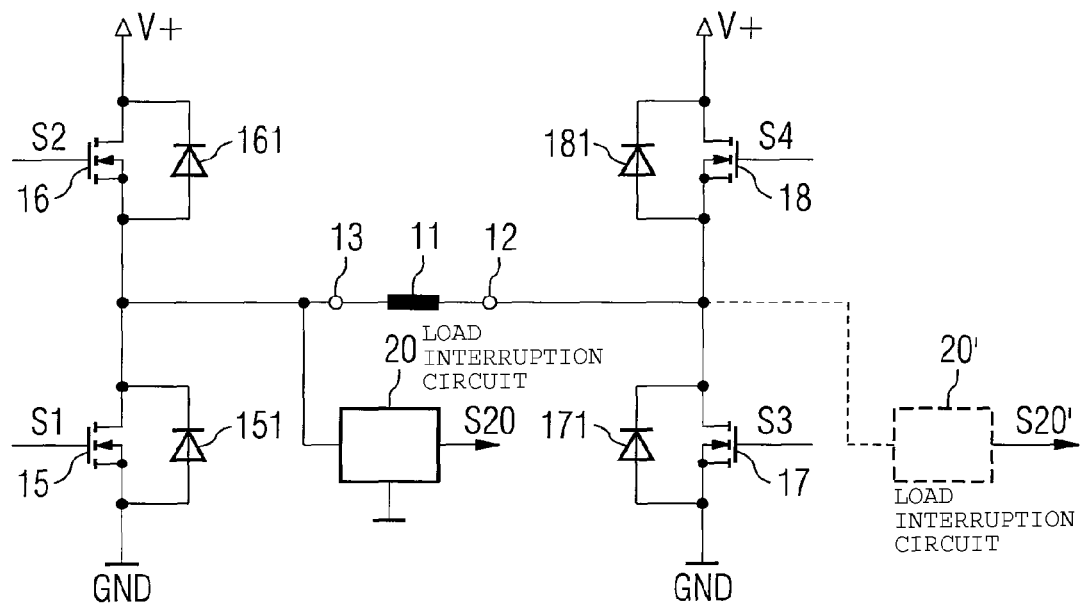
FIG. 11 shows a circuit arrangement, which has a bridge circuit, for driving a load.

FIG. 11 shows a further exemplary embodiment of a drive circuit for driving an inductive load. This drive circuit is in the form of a bridge circuit and has two half-bridges, each having two series-connected switches 15, 16, and 17, 18 respectively. The switches in the half-bridges in the illustrated example are in the form of semiconductor switches, specifically MOSFETs. A first of the half-bridges has a first semiconductor switch 15, which is connected as a low-side switch, and a second semiconductor switch 16, which is connected as a high-side switch. The semiconductor switches are in the form of MOSFETs and each have an integrated freewheeling diode, with these being annotated with the reference symbols 161 and 151. The second half-bridge has a third semiconductor switch 17, which is connected as a low-side switch, and a fourth semiconductor switch 18, which is connected as a high-side switch. The reference symbol 181 denotes an integrated freewheeling diode for the fourth semiconductor switch 18, and the reference symbol 171 denotes an integrated freewheeling diode for the third semiconductor switch 17.

A first connecting terminal of the bridge circuit illustrated in FIG. 11 is formed by a circuit node which is common to the third and fourth semiconductor switches 17, 18. A second connecting terminal 13 of the drive circuit is formed by a circuit node which is common to the first and second semiconductor switches 15, 16.

The semiconductor switches in the two half-bridges 15, 16 and 17, 18, respectively, are each connected between a terminal for a first supply potential V+ and a terminal for a reference ground potential GND, between which a supply voltage V is applied. The bridge circuit illustrated in FIG. 11 makes it possible to apply the supply voltage V between the first and the second connecting terminal 12, 13 with a first or a second polarity. The supply voltage which is applied between the first and second connecting terminals 12, 13 has a positive sign when the first and fourth switches 15, 18 in the bridge circuit are switched on, and the second and third switches 16, 17 are switched off. The supply voltage between the first and the second connecting terminals 12, 13 has a negative sign when the second and third switches 16, 17 are switched on, and the first and fourth switches 15, 18 are switched off. By way of example, the inductive load 11 may be an electric motor which rotates in a first rotation direction when the supply voltage is in the first polarity and in a second rotation direction when the supply voltage is in a second polarity.

For clocked application of a positive supply voltage between the connecting terminals 12, 13 and to the load 11 which is connected between the connecting terminals 12, 13, the third switch 17 is permanently switched off by means of a third drive circuit S3, the fourth switch 18 is permanently switched on via a fourth drive signal S4, and the first switch 15 is driven in a pulse-width-modulated manner by means of a first drive signal S1. The first connecting terminal 12 is therefore permanently connected to the positive supply potential V+ via the switched-on fourth switch 18. The bridge circuit illustrated in FIG. 11 operates corresponding to the drive circuit illustrated in FIG. 8 when in this operating state. The second switch 16 in the half-bridge in this case operates as a controlled freewheeling element which, after the first switch 15 has been opened, initially carries a freewheeling current, which is induced when the inductive load 11 is commutated off, via the integrated freewheeling element 161. This freewheeling element is connected in parallel with the series circuit comprising the load and the permanently switched-on fourth switch 18, and is therefore connected in parallel with the load, in a corresponding manner to the examples shown in FIGS. 1 and 8.

A first switch 20 is provided in order to detect a load interruption, is connected to the second connecting terminal 13, and operates in a corresponding manner to the circuit 20, as explained with reference to FIGS. 1 and 8, for identification of a load interruption.

For clocked application of a negative supply voltage between the first and second connecting terminals 12, 13, the first semiconductor switch 15 is permanently switched off via the first drive signal S1, and the second switch 16 is permanently switched on via the second drive signal S2. For clocked application of a negative supply voltage, the third semiconductor switch 17 is in this case driven in a pulse-width-modulated manner via the third drive signal S3. The fourth semiconductor switch 18 together with the integrated freewheeling diode 181 in this case operates as a freewheeling element which, after the third semiconductor switch 17 has been switched off, carries a freewheeling current caused by the inductive load 11. In order to detect a load interruption during this operating state, a further circuit 20' is provided, is connected to the second connecting terminal 12, and produces a second load interruption signal S20'. This circuit for identification of a load interruption 20' is provided in a corresponding manner to the circuit for identification of a load interruption 20. It is optionally possible to provide only one circuit for identification of a load interruption, with this circuit being selectively, that is to say as a function of the operating state of the bridge circuit, connected to the first or the second connecting terminal 12, 13.

In the case of the two methods of operation explained above, one of the connections 12, 13 of the load is permanently at the supply potential via one of the second and fourth switches 16, 18 of the bridge circuit, while the first or third switch 15, 17, which form low-side switches in the bridge circuit, is driven in a clocked form.

Furthermore, the bridge circuit can also be operated such that in each case one of the first and third switches 15, 17, that is to say one of the low-side switches, is permanently closed, while one of the second and fourth switches 16, 18, that is to say one of the high-side switches, is driven in a clocked manner. In order to apply a positive voltage to the load 11, the third switch 17 is switched on permanently, and the second switch 16 is driven in a clocked manner. The first switch 15 in this case operates as a switchable freewheeling element, which is switched on when the second switch 16 is switched off. In order to apply a negative voltage to the load 11, the first switch 15 is switched on permanently, and the fourth switch 18 is driven in a clocked manner. In this case, the third switch 17 operates as a switchable freewheeling element which is switched on when the fourth switch 18 is switched off. During the two last-mentioned operating phases, the bridge circuit operates in a corresponding manner to the circuit shown in FIG. 10.

The already explained bridge circuit may, of course, be produced using any desired semiconductor switches, in particular IGBTs, and is not restricted to the use of MOSFETs. When using IGBTs, which do not have integrated freewheeling diodes, instead of MOSFETs, separate freewheeling elements can be provided for off-commutation of the inductive load 11.

Figure 12:
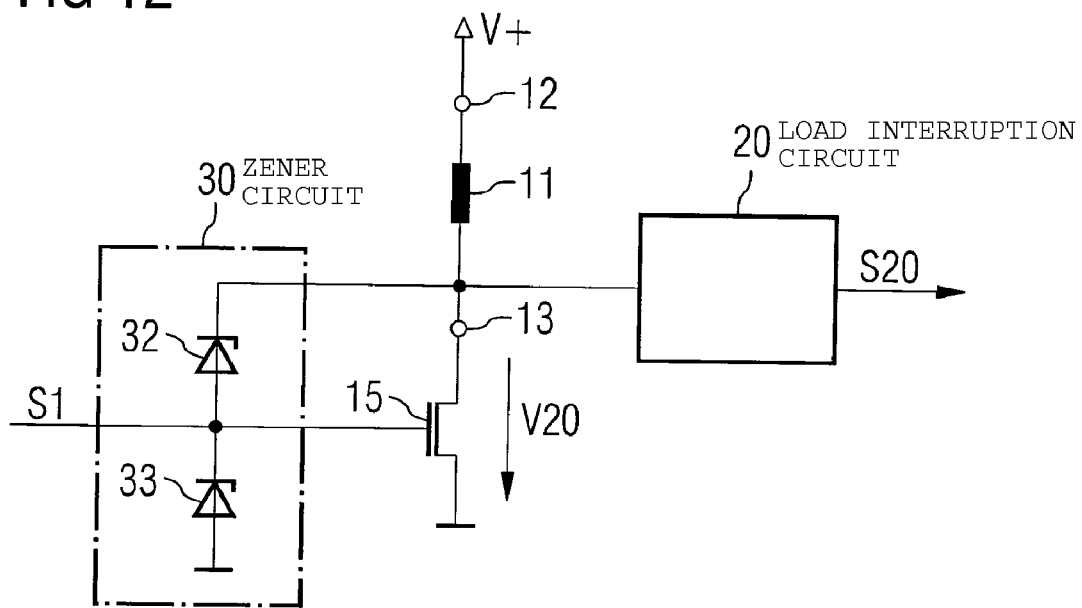
FIG. 12 shows a circuit arrangement for driving a load, which has a clamping circuit in order to limit the voltage drop across the load.

Instead of the already explained freewheeling elements which are connected in parallel with the load 11 and, in the explained examples, are in the form of freewheeling diodes, it is, of course, also possible to use any desired components or component arrangements which allow off-commutation of the load 11. One example of a component arrangement such as this is a circuit for "active zenering". FIG. 12 shows one such circuit for active zenering in conjunction with a drive circuit as shown in FIG. 1.

The zener circuit 30 in the case of this drive circuit is connected between the second connecting terminal 13 of the load 11 and the reference ground potential GND, and has a first zener diode 32. This first zener diode is connected in the reverse-biased direction between the second connecting terminal 13 and a drive connection of the switch 15 which, for example, is in the form of an MOS transistor. If the potential at the second connecting terminal 13 in this zener circuit 30 exceeds the breakdown voltage of the first zener diode after the switch 15 has been switched off and when an inductive load is present, then the switch is switched on by this zener diode 32. The switch therefore limits the electrical potential at the second connecting terminal 13 in the upward direction, and allows off-commutation of the load 11.

A second reverse-biased zener diode 33 is optionally connected between the drive connection of the switch 15 and the reference ground potential GND. This zener diode 33 is used to limit the drive voltage for the switch 15, particularly during the operating phase in which the switch 15 is switched on by the zener circuit in order to commutate the load 11 off.

The zener circuit 30 that has been explained may be used for off-commutation of the load 11 in all of the exemplary embodiments explained above. The use of a zener circuit such as this instead of freewheeling diodes has no effect on the method of operation of the circuit 20 for identification of a load interruption.

In general, with regard to the drive circuits that have been explained above, it can be said that the circuit 20 for identification of a load interruption 20 is connected to a circuit node which is located between the load, or a connecting terminal for the load, and a switch which is used for clocked application of a supply voltage to the load and for this purpose is driven in a pulse-width-modulated manner.

Figure 13:
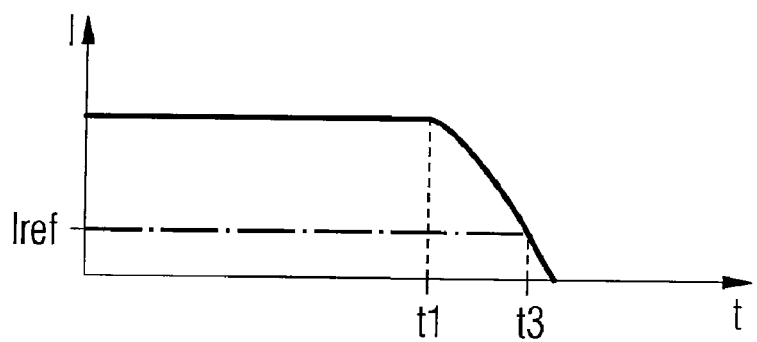
FIG. 13 illustrates a method for determination of an evaluation time.

By way of example, there is no need for the current source 23 which is optionally provided in the circuit for detection of a load interruption, in the case of the exemplary embodiment explained above, when the evaluation potential is evaluated at a time at which the switch which is used for application of the supply voltage has not yet been switched off completely after the start of a switched-off drive, that is to say a residual current is still flowing. FIG. 13 schematically illustrates a current I through a switch as explained above. After a switching-off time t1, at which the switch is begun to be switched off, the current in this case decreases continuously. The evaluation time t3 can in this case be defined on the basis of the current I flowing through the switch, by measuring the current through the switch and comparing this with a current reference value Iref. The evaluation time in this case corresponds to the time at which this current reaches the current reference value or falls below this current reference value.

The invention claimed is:

1. A method for detection of a presence of a load between a pair of nodes, the method comprising:
    applying and subsequently removing a supply voltage across the pair of nodes;
    comparing a first electrical potential that occurs at one of the pair of nodes at a time after the supply voltage is removed with a second electrical potential that occurs at the one of the pair of nodes at a time when the supply voltage is being applied; and
    generating a load interruption signal that depends upon whether the first electrical potential differs by more than a predetermined comparison value from the second electrical potential.

2. The method of claim 1, wherein applying, comparing, and generating are performed a plurality of times in a cyclic manner.

3. The method of claim 1, wherein the comparison value depends upon the supply voltage.

4. The method of claim 1, wherein the comparison value represents a voltage that is more than 50% of the supply voltage.

5. The method of claim 4, wherein the comparison value represents a voltage that is less than 75% of the supply voltage.

6. The method of claim 1, wherein the comparison value corresponds to a difference between the supply voltage and a fixed voltage.

7. The method of claim 1, wherein the comparison value is independent of the supply voltage.

8. An apparatus for detection of a presence of a load between a pair of nodes, the apparatus comprising:
    a first circuit portion configured to apply and subsequently remove a supply voltage across the pair of nodes; and
    a second circuit portion configured to compare a first electrical potential at one of the pair of nodes that occurs at a time after the supply voltage is removed with a second electrical potential that occurs at the one of the pair of nodes at a time when the supply voltage is being applied, and to generate a load interruption signal that depends upon whether the first electrical potential differs by more than a predetermined comparison value from the second electrical potential.

9. The apparatus of claim 8, further comprising a diode coupled between the pair of nodes.

10. The apparatus of claim 9, further comprising a transistor having a first source/drain node coupled to a first one of the pair of nodes and a second source/drain node coupled to a second one of the pair of nodes.

11. The apparatus of claim 8, wherein the first circuit portion comprises a switch coupled to one of the pair of nodes, the switch being configured to change between a nonconductive state and a conductive state in response to a second first signal.

12. The apparatus of claim 11, wherein the second circuit portion comprises a comparator having a first input coupled to one of the pair of nodes and a second input coupled to a reference voltage, wherein the comparison value depends upon the reference voltage.

13. The apparatus of claim 12, wherein the second circuit portion further comprises:
   a timer configured to receive the first signal and to output a delayed version of the first signal; and
   a flip flop having a data input configured to receive an output of the comparator and a clock input configured to receive the output of the timer.

14. The apparatus of claim 12, wherein the second circuit portion further comprises a current source configured to supply a current to the first input of the comparator.

15. An apparatus for detection of a presence of a load between a pair of nodes, the apparatus comprising:
   means for applying and subsequently removing a supply voltage across the pair of nodes; and
   means for comparing a first electrical potential that occurs at one of the pair of nodes at a time after the supply voltage is removed with a second electrical potential that occurs at the one of the pair of nodes at a time when the supply voltage is being applied, and for generating a load interruption signal that depends upon whether the first electrical potential differs by more than a predetermined comparison value from the second electrical potential.

16. An apparatus for detection of a presence of a load between a pair of nodes, the apparatus comprising:
   a first circuit portion configured to connect and subsequently disconnect a supply voltage source across the pair of nodes; and
   a second circuit portion configured to compare a first electrical potential that occurs at one of the pair of nodes at a time after the supply voltage is removed with a second electrical potential that occurs at the one of the pair of nodes at a time when the supply voltage is being applied, and to generate a load interruption signal that depends upon whether the first electrical potential differs by more than a predetermined comparison value from the second electrical potential.

17. The apparatus of claim 16, wherein the first circuit portion is configured to connect and disconnect the supply voltage source in response to a first signal, and the second circuit portion is configured to generate the load interruption signal in response to the first signal.

18. The apparatus of claim 16, wherein the first circuit portion is configured to connect and disconnect the supply voltage source in response to a first signal, and the second circuit portion is configured to generate the load interruption signal in response to a delayed version of the first signal.

19. The apparatus of claim 16, wherein the second circuit portion is configured to continuously compare the first electrical potential with the second electrical potential and to periodically generate the load interruption signal.

* * * * *

UNITED STATES PATENT AND TRADEMARK OFFICE
CERTIFICATE OF CORRECTION

| | |
|---|---|
| PATENT NO. | : 7,812,590 B2 |
| APPLICATION NO. | : 11/856425 |
| DATED | : October 12, 2010 |
| INVENTOR(S) | : Martin Kaltenegger et al. |

It is certified that error appears in the above-identified patent and that said Letters Patent is hereby corrected as shown below:

Claim 11, Column 13, Lines 2-3: "in response to a second first signal" has been changed to --in response to a first signal.--

Signed and Sealed this
Sixteenth Day of August, 2011

David J. Kappos
*Director of the United States Patent and Trademark Office*